(12) United States Patent
Mao et al.

(10) Patent No.: US 11,864,349 B2
(45) Date of Patent: Jan. 2, 2024

(54) VAPOR CHAMBER WITH STRUCTURE FOR ENHANCING TWO-PHASE FLOW BOILING

(71) Applicant: ASIA VITAL COMPONENTS (CHINA) CO., LTD., Shenzhen (CN)

(72) Inventors: Chunlin Mao, Shenzhen (CN); Xiao-Xiang Zhou, Shenzhen (CN); Xingxing Zhang, Shenzhen (CN); Han-Min Liu, Shenzhen (CN)

(73) Assignee: ASIA VITAL COMPONENTS (CHINA) CO., LTD., Shenzhen (CN)

( * ) Notice: Subject to any disclaimer, the term of this patent is extended or adjusted under 35 U.S.C. 154(b) by 0 days.

(21) Appl. No.: 17/500,950

(22) Filed: Oct. 14, 2021

(65) Prior Publication Data

US 2023/0121930 A1 Apr. 20, 2023

(51) Int. Cl.
*H05K 7/20* (2006.01)
*F28D 15/02* (2006.01)
*F28D 15/04* (2006.01)

(52) U.S. Cl.
CPC ..... *H05K 7/20336* (2013.01); *F28D 15/0233* (2013.01); *F28D 15/046* (2013.01)

(58) Field of Classification Search
CPC ............... F28D 15/046; F28D 15/0275; F28D 15/0233; F28D 15/04; F28D 15/02; H05K 7/20336
See application file for complete search history.

(56) References Cited

U.S. PATENT DOCUMENTS

2020/0182557 A1\* 6/2020 Lewis ..................... B23P 15/26
2020/0355444 A1\* 11/2020 Chen ................... F28D 15/0283

FOREIGN PATENT DOCUMENTS

| CN | 102595861 A | 7/2012 |
| CN | 104534906 A | 4/2015 |
| TW | M621971 U | 1/2022 |

OTHER PUBLICATIONS

Search Report dated Jun. 14, 2022 issued by Taiwan Intellectual Property Office for counterpart application No. 110137827.

\* cited by examiner

*Primary Examiner* — Tavia Sullens
*Assistant Examiner* — Khaled Ahmed Ali Al Samiri
(74) *Attorney, Agent, or Firm* — Demian K. Jackson; Jackson IPG PLLC

(57) ABSTRACT

A vapor chamber with structure for enhancing two-phase flow boiling includes a main body formed of a first and a second plate member, which are correspondingly closed to each other to define an airtight chamber between them. The airtight chamber has a condensing side and an evaporating side and has a working fluid filled therein. The evaporating side is formed on its surface with a plurality of projected sections and a plurality of recessed sections and has a wick structure provided thereon. The projected sections extend through and project beyond the wick structure, and the recessed sections are located below the wick structure without being filled by the wick structure to thereby form spaces for receiving the working fluid. The provision of the projected and the recessed sections enables the vapor chamber to provide largely enhanced two-phase flow boiling effect in the airtight chamber.

8 Claims, 2 Drawing Sheets

VAPOR CHAMBER WITH STRUCTURE FOR ENHANCING TWO-PHASE FLOW BOILING

FIELD OF THE INVENTION

The present invention relates to a vapor chamber with structure for enhancing two-phase flow boiling, and more particularly, to a vapor chamber structure capable of enhancing two-phase flow boiling effect in the vapor chamber.

BACKGROUND OF THE INVENTION

A vapor chamber is briefly referred to "VC" and includes a case internally defining an airtight chamber and internally provided a plurality of capillary wick structures and a working fluid. The working fluid can be water, coolant, methanol, acetone or liquid ammonia. Most of the VC cases currently available in the market are made of copper, aluminum or stainless steel. Since the working fluid in the vapor chamber transfers heat through the mechanism of latent heat of phase transition, the heat transfer ability of the vapor chamber is widely applied in the fields of electronic, spaceflight, arms and petrochemical industries.

In recent years, the chip heat flux density becomes higher and higher. For example, an application specific integrated circuit (ASIC) chip now has power consumption as high as 1000 W and heat flux density as high as 250 W/cm$^2$. Further, due to the problem of hot spot on chip or die, the requirement for the evaporation thermal resistance of a vapor chamber is increasingly strict. Besides, the current IC design trend is to use a die in the designed structure. Since the die used in the IC design is not shielded by other structures, the heat produced by the die directly and quickly diffuses outward to instantaneously generate a very large amount of thermal energy, which requires even quicker and immediate heat dissipation. Slow heat dissipation would cause overheating and accordingly, disability and damage to the chip or die. Therefore, heat transfer elements are necessary for immediately and quickly guiding away the large amount of heat produced by the die to cool the die.

Currently, most of the heat dissipation devices being used to carry heat away from the heat source are two-phase flow heat transfer elements, such as vapor chambers and heat popes. However, the conventional vapor chamber has a very basic structural configuration, that is, it simply has a case internally defining a vacuum chamber and a working fluid and a wick structure provided in the vacuum chamber. The case has an evaporating side that is in contact with a heat source, and the working fluid absorbs the heat transferred from the heat source to the evaporating side and is heated, and a vapor/liquid (or boiling/condensing) two-phase heat exchange takes place.

In the application of the two-phase transition of working fluid in the conventional vapor chamber or heat pipe, the capillary wick structure in the vapor chamber enables only simple evaporation or evaporation and film boiling. That is, the working fluid in the airtight chamber is vaporized or boiled and evaporation occurs on the wall surface of the heated airtight chamber; and the vapor is then condensed and flows back to the heated area through the wick structure. In other words, the working fluid in the airtight chamber undergoes a two-phase flow transition between the aforesaid evaporation and film boiling and the aforesaid condensation. For the conventional vapor chamber, the evaporation of the working fluid in the airtight chamber occurs only when the entire vapor chamber is heated to a boiling temperature capable of heating and boiling the working fluid. Since the area in the vapor chamber that can heat the working fluid to boil and vaporize is limited to the area that is in direct contact with the working fluid, and since the contact area between the working fluid and the vapor chamber is small, the evaporation efficiency of the conventional vapor chamber is low and it takes a relatively long time to vaporize the working fluid. However, in the working mechanism of latent heat of two-phase flow with phase transition, the fiercer the phase transition is, the stronger the latent heat exchange ability is. Therefore, the conventional vapor chamber structure could not provide quick and immediate heat dissipation to the currently designed IC, such as the use of a die, that generates a large amount of heat during work, and the conventional evaporation and film boiling occurred in the two-phase flow heat transfer is apparently insufficient for cooling the heat source that quickly or instantaneously generates a large amount of heat. Therefore, a first goal for today is to increase the pool boiling or flow boiling in the vapor chamber in order to provide a structure enabling quick and immediate two-phase flow phase transition to cope with the large amount of heat generated by the high heat generating chips and dies.

SUMMARY OF THE INVENTION

To overcome the above-mentioned problem, it is a primary object of the present invention to provide a vapor chamber with structure for enhancing two-phase flow boiling effect in the vapor chamber.

To achieve the above and other objects, the vapor chamber with structure for enhancing two-phase flow boiling according to the present invention includes a main body formed of a first and a second plate member, which are correspondingly closed to each other to define an airtight chamber between them. The airtight chamber has a condensing side and an evaporating side and has a working fluid filled therein. The evaporating side has a wick structure provided on a surface thereof and is provided with a plurality of projected sections and a plurality of recessed sections. The projected sections extend through and project beyond the wick structure, and the recessed sections are located below the wick structure without being filled by the wick structure to thereby form spaces for receiving the working fluid. The provision of the projected and the recessed sections enables the vapor chamber to provide largely enhanced two-phase flow boiling effect in the airtight chamber.

The surface of the conventional wick structure usually enables evaporation and film boiling only. However, in the working mechanism of latent heat of two-phase flow with phase transition, the fiercer the phase transition is, the stronger the latent heat exchange ability is. In the present invention, the projected sections and the recessed sections provided on the evaporating side of the vapor chamber cause fiercer phase transition to enable upgraded latent heat exchange ability. Further, with the projected sections that project beyond the surface of the wick structure and the recessed sections that are located below the surface of the wick structure to provide a plurality of spaces for receiving the working fluid, a plurality of structures enabling pool boiling, film boiling and flow boiling is formed, so that vapor bubbles between the wick structure and the projected and the recessed sections can quickly escape from the evaporating side to upgrade the latent heat exchange ability of the vapor chamber.

BRIEF DESCRIPTION OF THE DRAWINGS

The structure and the technical means adopted by the present invention to achieve the above and other objects can

DETAILED DESCRIPTION OF THE PREFERRED EMBODIMENTS

The present invention will now be described with some preferred embodiments thereof and by referring to the accompanying drawings.

Figure 1:
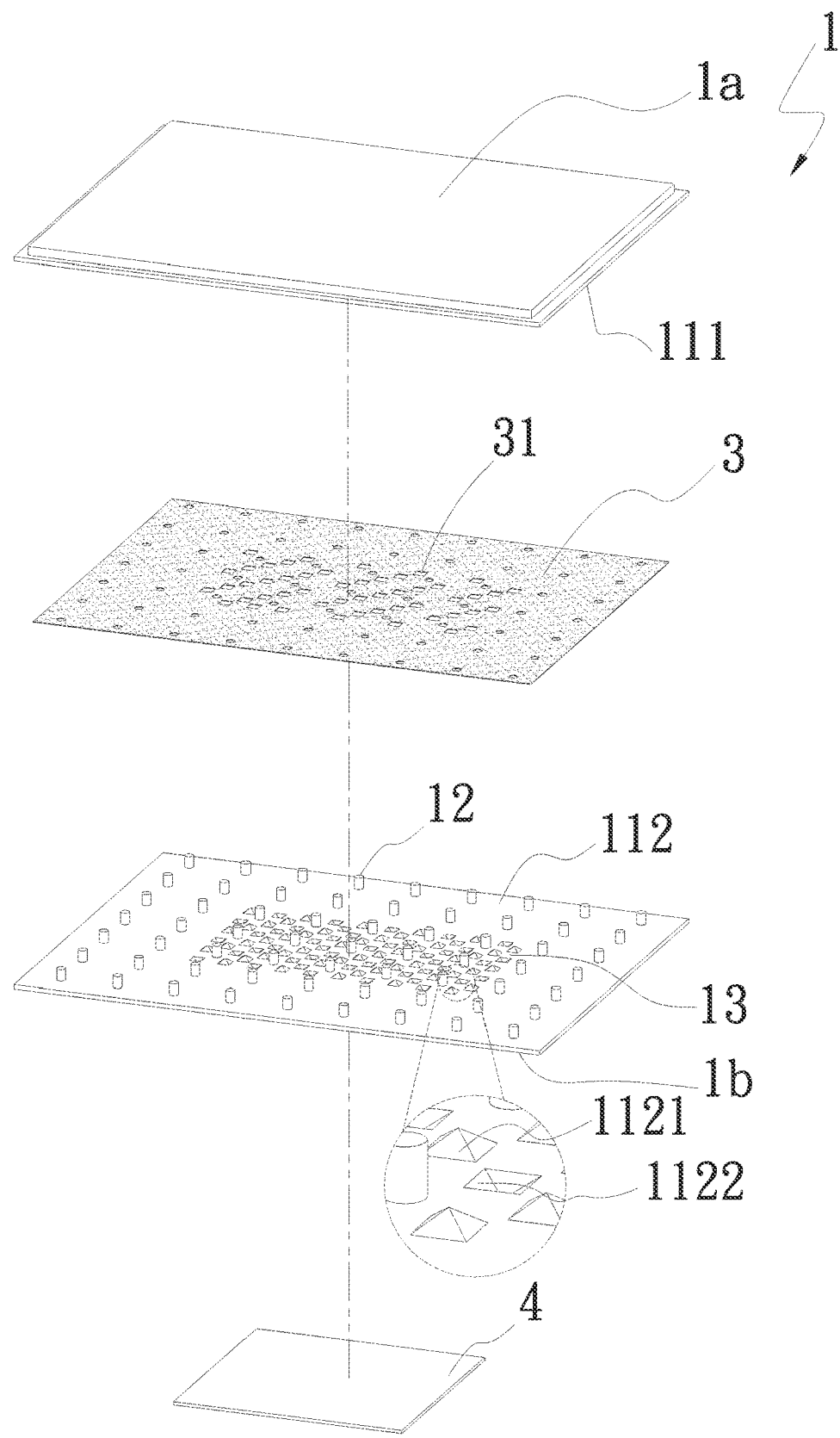
FIG. 1 is an exploded perspective view of a vapor chamber with structure for enhancing two-phase flow boiling according to a preferred embodiment of the present invention.
Figure 2:
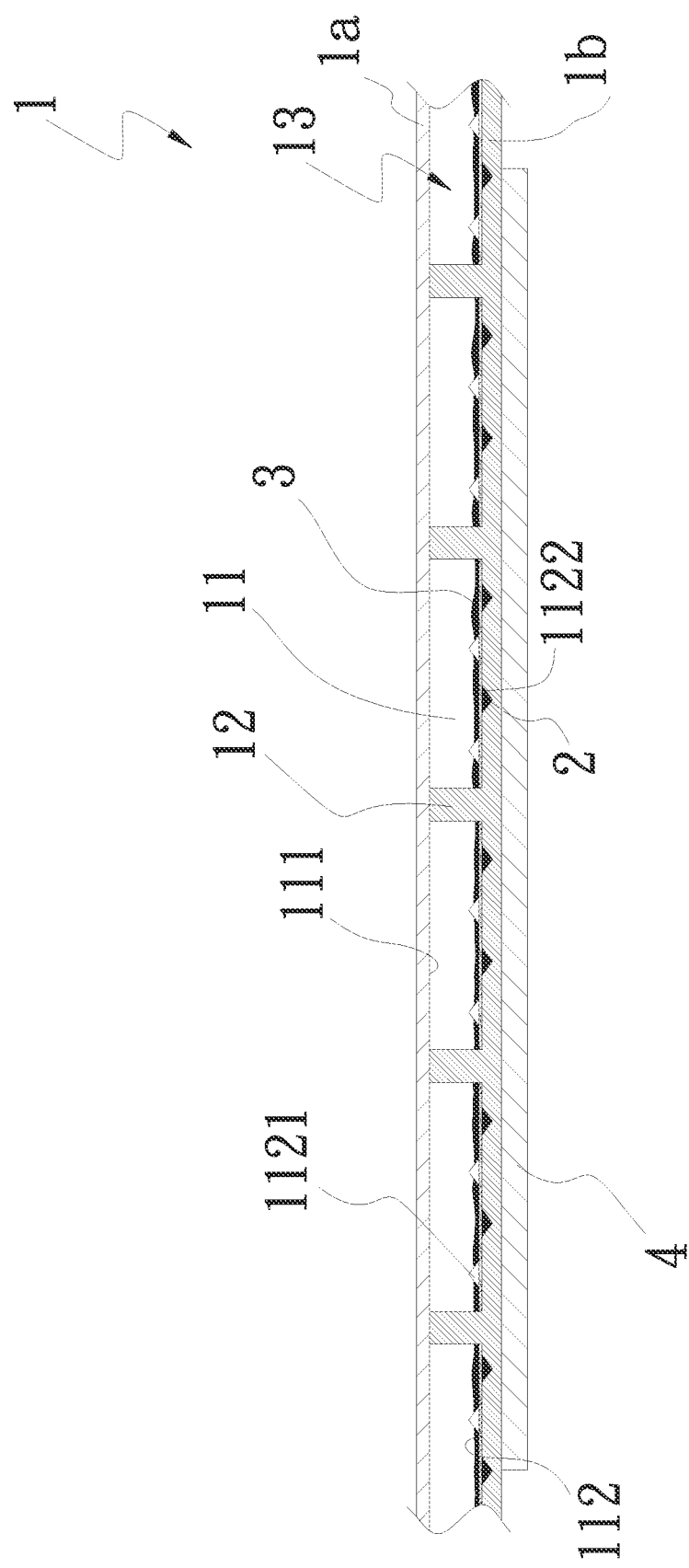
FIG. 2 is an assembled sectional side view of the vapor chamber of FIG. 1.

Please refer to FIGS. 1 and 2, which are exploded perspective view and assembled sectional side view, respectively, of a vapor chamber with structure for enhancing two-phase flow boiling according to a preferred embodiment of the present invention. As shown, the vapor chamber of the present invention includes a main body 1.

The main body 1 is a hollow case including a first plate member 1a having a first inner side and a first outer side, and a second plate member 1b having a second inner side and a second outer side. The first and the second plate member 1a, 1b are correspondingly closed to internally define an airtight chamber 11 between them. The airtight chamber 11 has a condensing side 111 formed at the first inner side and an evaporating side 112 formed at the second inner side, and has a working fluid 2 filled therein. The evaporating side 112 has a wick structure 3 provided on a surface thereof. The wick structure 3 can be powder sintered structure, mesh structure, woven structure or fibrous structure, or any combination thereof. In the preferred embodiment, the wick structure 3 is non-restrictively illustrated as a woven structure. The woven wick structure 3 has a plurality of through holes.

The airtight chamber 11 internally includes a plurality of supporting structures 12, which has two ends connected to the condensing side 111 and the evaporating side 112, respectively. The supporting structures 12 can be a plurality of supporting posts or a plurality of supporting rings. In the preferred embodiment, the supporting structures 12 are non-restrictively illustrated as supporting posts. The supporting structures 12 in the form of supporting posts can be detachably or directly protruded from the condensing side 111 or the evaporating side 112 toward the other side.

The evaporating side 112 is formed with a plurality of projected sections 1121 and a plurality of recessed sections 1122. The projected sections 1121 extend through a plurality of through holes 31 formed on the wick structure 3 to project beyond the wick structure 3. The through holes 31 respectively have a hole size equal to or larger than a base size (or diameter) of the projected section 1121. Since the wick structure 3 is flatly spread on the surface of the evaporating side 112 and the recessed sections 1122 respectively form a sunken area on the surface of the evaporating side 112, the wick structure 3 covers but does not fill internal spaces of the recessed sections 1122. That is, the recessed sections 1122 are located below the wick structure 3 and define a plurality of spaces capable of receiving the working fluid 2 therein. The projected sections 1121 respectively have an apex, which is not in contact with the condensing side 111.

Another side of the main body 1 located corresponding to the evaporating side 112, i.e. the second outer side of the main body 1, is in contact with at least one heat source 4 to absorb heat produced by the heat source 4. Further, the evaporating side 112, i.e. the second inner side of the main body 1, has a heated area 13 located corresponding to the heat source 4. In the preferred embodiment, the projected sections 1121 and the recessed sections 1122 are provided in the heated area 13. However, the projected sections 1121 and the recessed sections 1122 may also be provided in non-heated areas, that is, areas located outside and around the heated area 13. The projected sections 1121 and the recessed sections 1122 can be arrayed to be equally spaced or irregularly spaced from one another or can be densely arrayed or dispersedly arrayed. Alternatively, the projected sections 1121 and the recessed sections 1122 can have the same or different sizes, thicknesses and depths or any combination thereof.

The through holes 31 are formed on the wick structure 3 at areas corresponding to the projected sections 1121, and respectively have a size larger than or equal to an outer diameter of the corresponding projected sections. In the case the through holes 31 respectively have a size larger than the outer diameter of the corresponding projected sections 1121, there is a clearance existed between each of the through holes and each corresponding one of the projected sections 1121. On the other hand, in the case the through holes 31 respectively have a size equal to the outer diameter of the corresponding projected sections 1121, the wick structure 3 is fitly attached to the projected sections 1121.

In the case the through holes 31 respectively have a size equal to the outer diameter of the corresponding projected sections 1121, a part of the working fluid 2 that is condensed and attached to the projected sections 1121 can quickly flow back to the evaporating side 112 along the wick structure 3 that is in contact with the projected sections 1121. In the case the through holes 31 respectively have a size larger than the outer diameter of the corresponding projected sections 1121, the vaporized working fluid 2 can quickly diffuse outward via the clearance between the through holes 31 and the projected sections 1121.

In the present invention, the projected sections 1121 and the recessed sections 1122 can be in the form of pyramids or polyhedrons. In the preferred embodiment, the projected sections 1121 and the recessed sections 1122 are illustrated as pyramids. Further, the projected sections 1121 can respectively be a square pyramid with an obtuse-angled top or an acute-angled top. The projected sections 1121 respectively have a width about 1.5 mm and project beyond a surface of the wick structure 3 by 1 to 2 mm or so. The recessed sections 1122 respectively have a width about 0.3 to 0.5 mm and a depth about 0.2 to 0.3 mm. The wick structure 3 is just located between the projected sections 1121 and the recessed sections 1122.

As can be found from related literature, when a liquid is boiling, the boiling state can be divided into two major types. In the first boiling type, namely, homogeneous boiling, the boiling vapor nucleus grows in liquid bulk phase, and there is not solid heated surface existed in the liquid. In the second boiling type, namely heterogeneous boiling, boiling occurs when the liquid is in contact with a solid heated surface. Wherein, heterogeneous boiling is the most commonly seen and the most practically valuable boiling type in general daily life and industrial applications.

Further, according to the liquid flowing state, boiling can be divided into pool boiling and flow boiling. Pool boiling occurs on a heated surface submerged in a stagnant liquid pool, and flow boiling occurs in a flowing stream. Both of these two types of boiling are important in many industrial applications.

The conventional vapor chamber enables two-phase flow heat transfer through evaporation and film boiling only, which could not enable timely and quick transfer of the high amount of heat produced by high-power chips or dies. Therefore, it is necessary to enhance the boiling state in the vapor chamber to upgrade an overall heat transfer efficiency thereof.

The present invention is characterized in that, when the main body 1 of the vapor chamber is heated, the projected sections 1121 serve to guide vapor formed by the evaporated working fluid 2 to diffuse upward; and low-lying areas formed between the projected sections 1121 and pits (i.e. water pits) formed between the recessed sections 1122 separate the original large area of the main body 1 in contact with the working fluid 2 into a plurality of small areas. These small areas enable the working fluid 2 in the main body 1 that is heated to form small nucleus of water to boil fast (i.e. to get nucleate boiling), so that bubbles produced due to the evaporation of the working fluid 2 quickly escape and vaporize to form pool boiling and flow boiling at the same time, which causes fierce two-phase transition of the working fluid 2 in the main body 1. Unlike the conventional vapor chamber, the main body 1 of the vapor chamber of the present invention enables different types of boiling phase transition, including pool boiling, film boiling and flow boiling, to occur in the main body 1 at the same time, and accordingly, enables faster heat transfer through the two-phase flow transition, so that the vapor chamber can immediately or instantaneously provide quick heat spreading effect. Compared to the conventional vapor chamber that uses the wick structure to provide heat transfer only through conventional evaporation and film boiling, the present invention has the ability of forming fierce phase transition to enhance latent heat exchange and accordingly provides much more significant heat transfer efficiency than the conventional vapor chamber.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A vapor chamber with structure for enhancing two-phase flow boiling comprising:
    a main body including a first plate member and a second plate member, which are correspondingly closed to define an airtight chamber between them, the airtight chamber having a condensing side and an evaporating side;
    a working fluid filled in the airtight chamber;
    a wick structure arranged within the airtight chamber and on a surface of the evaporating side; and
    a plurality of discrete projected sections and a plurality of discrete recessed sections formed on the evaporating side such that the projected sections extend through and project beyond the wick structure, and such that the discrete recessed sections are each located below the wick structure without being filled by the wick structure and are not in direct fluid communication with other recessed sections to thereby form discrete spaces for receiving the working fluid.

2. The vapor chamber with structure for enhancing two-phase flow boiling as claimed in claim 1, wherein the projected sections are upward protruded from the surface of the evaporating side and respectively have an apex that is not in contact with the condensing side, and the recessed sections are sunken from the surface of the evaporating side to form a plurality of water pits.

3. The vapor chamber with structure for enhancing two-phase flow boiling as claimed in claim 1, wherein an outer side of the main body located corresponding to the evaporating side is in contact with at least one heat source to absorb heat produced by the heat source; the evaporating side having a heated area located corresponding to the heat source, and the projected sections and the recessed sections being provided in the heated area.

4. The vapor chamber with structure for enhancing two-phase flow boiling as claimed in claim 1, wherein the airtight chamber internally includes a plurality of supporting structures, each of which has two ends connected to the condensing side and the evaporating side, respectively.

5. The vapor chamber with structure for enhancing two-phase flow boiling as claimed in claim 1, wherein the projected sections and the recessed sections are respectively a polyhedron.

6. The vapor chamber with structure for enhancing two-phase flow boiling as claimed in claim 1, wherein the projected sections respectively have an obtuse angled or an acute-angled apex.

7. The vapor chamber with structure for enhancing two-phase flow boiling as claimed in claim 1, wherein the wick structure is selected from the group consisting of powder sintered structure, mesh structure, woven structure, fibrous structure, and any combination thereof.

8. The vapor chamber with structure for enhancing two-phase flow boiling as claimed in claim 1, wherein the condensing side is formed at an inner surface of the first plate member, and the evaporating side is formed at an inner surface of the second plate member.

* * * * *